United States Patent
Tanabe et al.

(10) Patent No.: US 6,657,154 B1
(45) Date of Patent: *Dec. 2, 2003

(54) SEMICONDUCTOR MANUFACTURING APPARATUS AND MANUFACTURING METHOD FOR THIN FILM SEMICONDUCTOR DEVICE

(75) Inventors: Hiroshi Tanabe, Tokyo (JP); Setsuo Kaneko, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/866,331

(22) Filed: May 30, 1997

(30) Foreign Application Priority Data

May 31, 1996 (JP) .............................................. 8/137895

(51) Int. Cl.⁷ ...................... B23K 26/00; B23K 26/073; B23K 26/02
(52) U.S. Cl. ............................. 219/121.6; 219/121.75; 219/121.82; 219/121.85; 219/121.86; 438/166; 438/487; 438/795; 438/908; 422/245.1; 422/250.1
(58) Field of Search ................................. 438/908, 487, 438/166, 795, 151; 118/620; 219/121.6, 121.75, 121.82, 121.85, 121.86; 422/108

(56) References Cited

U.S. PATENT DOCUMENTS

| | | | |
|---|---|---|---|
| 4,505,950 A | * | 3/1985 | Yamazaki .................... 427/38 |
| 4,529,617 A | * | 7/1985 | Chenevas-Paule et al. . 427/53.1 |
| 4,670,063 A | * | 6/1987 | Schachameyer et al. |
| 4,800,174 A | * | 1/1989 | Ishihara et al. |
| 5,043,299 A | * | 8/1991 | Chang et al. |
| 5,194,398 A | * | 3/1993 | Miyachi et al. |
| 5,294,572 A | * | 3/1994 | Granneman et al. |

(List continued on next page.)

FOREIGN PATENT DOCUMENTS

| | | |
|---|---|---|
| JP | 56-51147 | 5/1981 |
| JP | 58-201326 | 11/1983 |
| JP | 62-51147 | 3/1987 |
| JP | 63-147313 | 6/1988 |
| JP | 2-81424 | 3/1990 |
| JP | 5-182923 | 7/1993 |
| JP | 5-211167 | 8/1993 |
| JP | 6-333823 | 12/1994 |

OTHER PUBLICATIONS

M. Sekiya et al., "High Performance Poly–Crystalline Silicon Thin Film Transistors Fabricated . . . Vapor Deposition of $SiO_2$", *IEEE Electron Device Letters*, vol. 15, No. 2, Feb. 1994, pp. 69–71.

M. Sekiya et al., "High Performance Poly–Crystalline Silicon Thin Film Transistors Fabricated . . . Vapor Deposition of $SiO_2$", *IEEE Electron Device Letters*, vol. 15, No. 2, Feb. 1994, pp. 69–71.

Primary Examiner—Mary Wilczewski
(74) Attorney, Agent, or Firm—Sughrue Mion, PLLC (57) ABSTRACT

In a manufacturing technology for forming a thin film transistor comprising a laser irradiation step, objects of the present invention are to obtain a high performance and multifunction semiconductor manufacturing apparatus and thin film transistor manufacturing method. A silicon thin film 201 is formed on a glass substrate 202, and laser 203 is irradiated onto this thin film 201 whereby a re-crystallization film is obtained. This re-crystallization film undergoes a hydrogen plasma processing so that dangling-bonds of silicon are terminated. Moreover, a step for forming a silicon dioxide film 205 on the re-crystallization film is included. These steps are performed under the conditions that the glass substrate 202 is not exposed to the air and a processing temperature is 350° C. or less.

1 Claim, 10 Drawing Sheets

U.S. PATENT DOCUMENTS

| | | | |
|---|---|---|---|
| 5,296,405 A | * | 3/1994 | Yamazaki et al. |
| 5,304,357 A | * | 4/1994 | Sato et al. |
| 5,322,589 A | * | 6/1994 | Matsuoka et al. |
| 5,372,836 A | * | 12/1994 | Imahashi et al. .............. 427/8 |
| 5,380,682 A | * | 1/1995 | Edwards et al. |
| 5,413,958 A | * | 5/1995 | Imahashi et al. |
| 5,420,044 A | * | 5/1995 | Kozuka |
| 5,472,507 A | * | 12/1995 | Yamaguchi et al. ......... 118/722 |
| 5,529,630 A | * | 6/1996 | Imahashi et al. ........... 118/685 |
| 5,578,520 A | * | 11/1996 | Zhang et al. |
| 5,591,668 A | * | 1/1997 | Maegawa et al. |
| 6,124,154 A | * | 9/2000 | Miyasaka ................... 438/151 |
| 6,261,877 B1 | * | 7/2001 | Yamazaki et al. .......... 438/151 |

* cited by examiner

SEMICONDUCTOR MANUFACTURING APPARATUS AND MANUFACTURING METHOD FOR THIN FILM SEMICONDUCTOR DEVICE

BACKGROUND OF THE INVENTION

1. Field of the Invention

The present invention relates to a semiconductor manufacturing apparatus for manufacturing a thin film transistor device formed on a glass substrate of a large area and a manufacturing method for the thin film transistor. The present invention particularly relates to a laser crystallization semiconductor thin film formation apparatus using an ultraviolet pulse laser and a manufacturing method for a polycrystalline semiconductor thin film transistor.

2. Description of the Related Art

Heretofore, a transistor having a MOS (metal-oxide film-semiconductor) structure has been widely used for such as a large scale integrated circuit (LSI). Particularly, in silicon LSI manufacturing processes, since there is a thermal oxide step employing a high temperature process of about 1000° C. for formation of a MOS structure on a silicon wafer, it is easy to produce a clean oxide film-silicon interface.

On the other hand, in manufacturing processes for formation of a so called high temperature polysilicon thin film transistor to be applied to liquid crystal light valves, after an a(amorphous)-Si thin film on a quartz substrate is crystallized by a solid phase growth, patterning and acid-cleaning are conducted for a silicon layer, and an oxide film formation at a high temperature of about 1000° C. are conducted. Since a native oxide film formed at the time of the acid-cleaning is removed during heating, an oxide film is formed on a clean surface of the silicon layer.

However, in a low temperature polysilicon TFT process which is conducted at a temperature below 400° C. using excimer laser annealing, since such a high temperature process can not be employed, means for removing the native oxide film on the silicon surface formed after the acid-cleaning is required. For this reason, a method to sequentially conduct formation of a silicon film, laser irradiation, patterning and cleaning of the silicon film, and formation of a gate insulating film are said to be general, and a cleaning step after patterning plays an important role in,stability and reproducibility of manufacturing processes.

For a way to solve such problems, M. Sekiya et al. has proposed the apparatus composed of an insulating film formation chamber, a laser irradiation chamber, and a hydrogenation chamber, all capable of transporting a substrate in vacuum, in IEEE ELECTRON DEVICE LETTERS, Vol. 15, No. 2, 1994 page 69. In this apparatus, after an amorphous silicon film formed on a glass substrate is crystallized by a laser, hydrogenation and formation of a gate insulating film are conducted sequentially in the same apparatus.

However, according to a manufacturing method using this apparatus, although the silicon surface after crystallization using the laser is kept clean, removal of a native oxide film produced before crystallization by the laser is insufficient. In other words, the native oxide film itself or impurity metal atoms contained in the native oxide film induces variations in the laser crystallization step whereby reproducibility of the process is deteriorated. Moreover, in a case where a subsequent step such as laser crystallization or formation of a thin film is performed after the silicon thin film previously formed is once exposed to the air, cleaning with cleaning liquid such as ammonia/hydrogen peroxide/pure water, hydrochloric acid/hydrogen peroxide/pure water, sulfuric acid/hydrogen peroxide, hydrofluoric acid/pure water or cleaning with heated liquid prepared by heating them must be conducted prior to a next step. The amount of these acid-alkaline type cleaning liquids to be used increases in accordance with an increase in a size of the glass substrate, resulting in an increase in a cleaning liquid cost and waste liquid cost.

Figure 1:
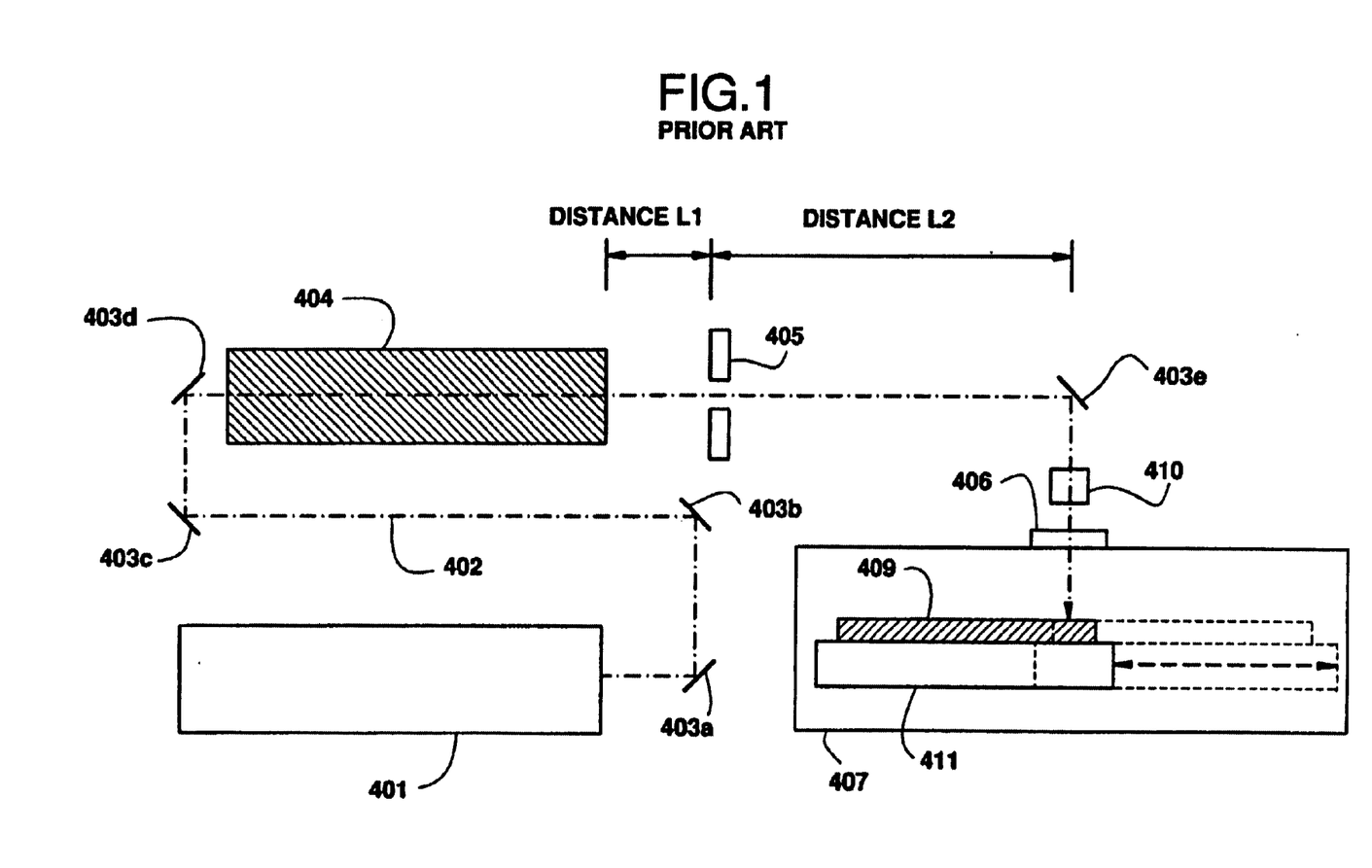
FIG. 1 is a schematic constitutional view showing a conventional laser irradiation chamber.

On the other hand, the excimer laser annealing apparatus has required a wider setting area than before in accordance with an enlargement of a size of the glass substrate. Particularly, in the laser irradiation chamber, a size of the substrate is larger than an irradiation area, covered by one irradiation of the laser beam. As shown in FIG. 1, while horizontally moving the glass substrate 409 set in the vacuum container constituting the ELA (Excimer Laser Annealing) module 407, the entire surface of the substrate will be crystallized by laser irradiation. In case of such method, when the glass substrate 409 is moved only in one direction on the plane, the setting area of the vacuum container must be two times as large as a size of the glass substrate, and when the glass substrate 409 is moved in two directions on the plane, both directions being perpendicular to each other, the setting area of the vacuum container must be four times as large as the size of the glass substrate. Specifically, laser beam emitted from the excimer laser 401 travels along the optical path 402, and it passes through the A to C. optical apparatuses 404, 405, and 410 and the mirrors 403a to 403e, the optical apparatuses serving to shape the laser beam to the desired beam. After the laser beam is shaped to the desired beam, it reaches the surface of the glass substrate 409 through the window 406. The glass substrate 409 is fixed to the substrate holder 411 on the stage which is capable of moving in x- and y-directions on the plane. The glass substrate 409 undergoes laser irradiation on its desired region. In this case, the setting area of the vacuum container must be four times as large as a size of the glass substrate. More specifically, if a substrate has a length dimension, then the vacuum chamber has a dimension which is more than twice the substrate length. However, enlargement of the setting area is not desirable because of an increase in cost of clean room equipment. When a process room equipped with a plurality of functions is arranged in a limited setting area, the space of the laser irradiation room limits the space of a process room equipped with other functions.

Moreover, while keeping the semiconductor surface (interface) clean, although a wet cleaning step for the above-described substrate is omitted, when an irradiation step is conducted, there has been the following problem. Specifically, as disclosed in Japanese Patent Application Laid Open No. 5-211167, when laser irradiation is required for a certain region, (1) a system to previously form a marker for positioning and (2) a system to form an integrated circuit fitting to a region where the laser irradiation was conducted are needed.

Figure 2A:
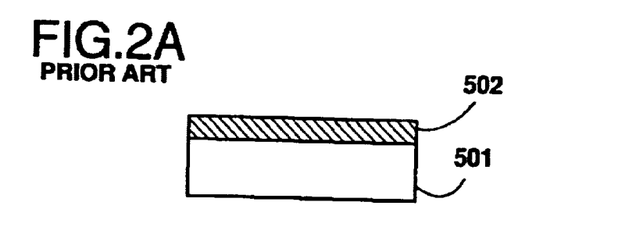
FIG. 2A–FIG. 2E are section views and an upper plan view for explaining a formation method of a mark using a conventional laser irradiation.
Figure 2B:
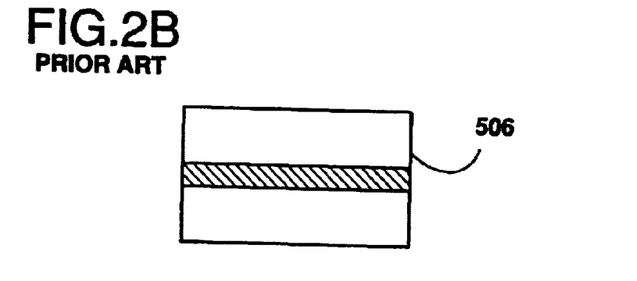
Figure 2C:
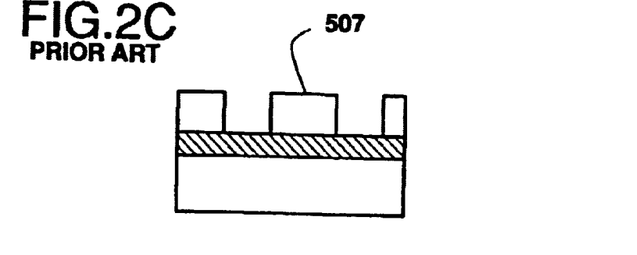
Figure 2D:
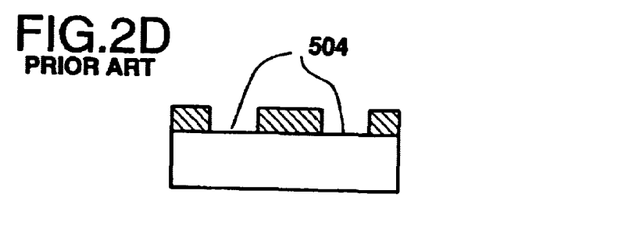
Figure 2E:
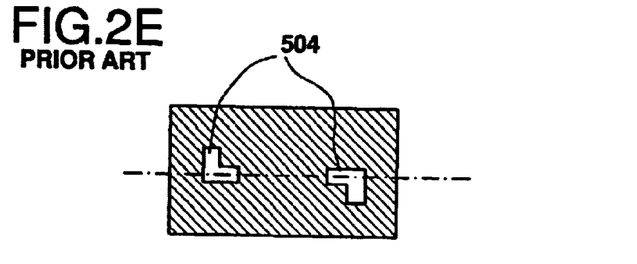

In case of the system (1), after a certain thin film is formed, resist patterning using photolithography (PR) and thin film etching are conducted, and a marker is formed. Thereafter, cleaning is performed using the acid-alkaline cleaning liquid described above. Subsequently, a silicon thin film is formed, and laser irradiation fitting to the marker position is conducted, whereby a crystallized silicon thin film can be produced. Alternatively, as shown in FIGS. 2A to 2E, the silicon thin film 502 is first formed on the entire surface of the glass substrate 501 (FIG. 2A). The resist 506 is coated on the silicon thin film 502 (FIG. 2B). The resist 506 undergoes patterning using a photolithography technique, whereby the resist 507 for developing is formed (FIG. 2C). Thereafter, the mark portion 504 is formed by dry etching (FIGS. 2D and 2E).

On the other hand, in case of the system (2), a means for detecting the laser crystallization position using a certain method is required, and it is difficult to obtain a level positioning precision required by a stepper and the like. Also according to the system (1), an increase in cost due to an additional PR step and an additional cleaning step is incurred. In a case where a marker is formed directly on a silicon film, the surface of the silicon undergoes the PR step, so that cleaning with a precision is needed. A more simplified marker formation means is required.

SUMMARY OF THE INVENTION

The first object of the present invention is to provide a multifunction semiconductor manufacturing apparatus with a high stability, which is capable of eliminating cleaning steps using chemicals. The second object of the present invention is to provide a compact-sized semiconductor manufacturing apparatus which is capable of crystallizing a substrate by a laser without moving the substrate and promoting multi-function characteristics of the apparatus. Furthermore, the third object of the present invention is to provide mark formation means which requires needs no photolithography steps. Still further, the fourth object of the present invention is to provide a low cost and high performance thin film transistor manufacturing apparatus which is capable of keeping a silicon clean surface (interface).

A semiconductor manufacturing apparatus of the present invention comprises at least a silicon thin film formation chamber or a dry cleaning chamber, an insulator thin film formation chamber, a laser irradiation chamber, and a hydrogen annealing chamber, wherein a substrate on which a semiconductor device is formed can be transported between treating chambers without being exposed to the air.

For a laser irradiation means in the semiconductor manufacturing apparatus of the present invention, a laser light source and an optical system for shaping a laser beam from the laser light source are provided, which is constituted such that said laser beam is irradiated onto a substrate set in a vacuum container. Part of the optical system is disposed within said vacuum container, and the part of the optical system disposed within the vacuum container moves relative to the substrate whereby the laser beam can be irradiated onto the entire surface of the substrate or almost all regions thereof. In this case, an area irradiated by one laser beam is smaller than the area of the substrate, and the laser beam is irradiated onto the substrate without changing the optical path of the optical system. Alternatively, for a laser irradiation chamber, first and second laser light sources are provided, wherein a laser beam from said first laser light source and a laser beam from said second laser light source are individually or simultaneously irradiated onto the substrate set within the vacuum container.

Furthermore, the thin film transistor manufacturing method of the present invention comprises the steps of: forming a silicon thin film on a glass substrate; irradiating a laser onto said silicon thin film thereby obtaining a re-crystallization silicon film; performing a hydrogen plasma treatment for said re-crystallization silicon film thereby terminating dangling-bonds of the silicon; and forming a silicon dioxide film on said re-crystallization silicon film, wherein said steps are performed under conditions of not being exposed to the air and at a processing temperature of 350° C. or less. Alternatively, the thin film transistor manufacturing method of the present invention comprises the steps of: forming a silicon thin film on a glass substrate; forming a silicon dioxide film on said silicon thin film; irradiating a laser onto said silicon thin film thereby obtaining a re-crystallization silicon film; and performing a hydrogen plasma treatment for said re-crystallization silicon film thereby terminating dangling-bonds of the silicon, wherein said steps are performed under conditions of not being exposed to the air arid at a treatment temperature of 350° C. or less. These manufacturing methods should include a removing step for the silicon thin film using a laser after formation of the silicon thin film.

The above and other objects, features and advantages of the present invention will become apparent from the following description based on the accompanying drawings which illustrate an example of a preferred embodiment of the present invention.

DETAILED DESCRIPTION OF THE PREFERRED EMBODIMENTS

An embodiment of the present invention will be described with reference to the accompanying drawings.

Figure 3:
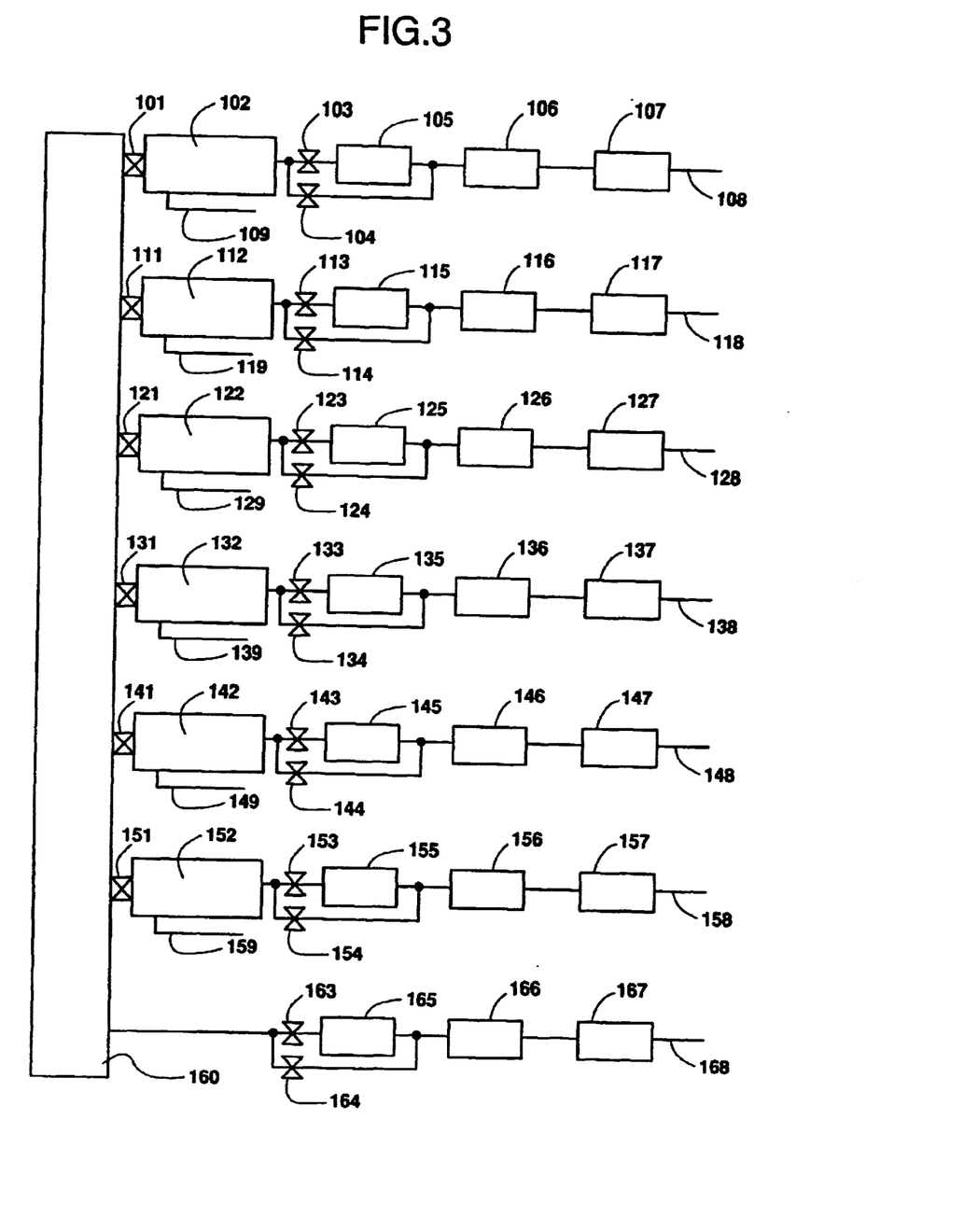
FIG. 3 is a block diagram showing a schematic constitution of a semiconductor manufacturing apparatus of the present invention.

FIG. 3 is a block diagram showing a schematic constitution of a semiconductor manufacturing apparatus of the present invention. This semiconductor manufacturing apparatus comprises a vacuum load chamber 102, a Si formation chamber 112, a laser irradiation chamber 122, an insulating film formation chamber 132, a hydrogen annealing chamber 142, a substrate unload chamber 152 and a substrate transportation chamber 160. Furthermore, the substrate transportation chamber 160 and other treatment chambers are mutually coupled through vacuum valves 101, 111, 121, 131, 141 and 151.

Consequently, a glass substrate on which a thin film transistor is to be formed is introduced into this apparatus from the vacuum load chamber 102. The glass substrate can be transported to any processing chamber through the substrate transportation chamber 160 and the foregoing vacuum valves 101, 111, 121, 131, 141 and 151. Each processing chamber is coupled to the exhaust system, which is made up of turbo molecule pumps 105, 115, 125, 135, 145, 155 and 165, connecting through vacuum valves 103, 113, 123, 133, 143, 153 and 163, booster pumps 106, 116, 126, 136, 146, 156, and 166, connecting through vacuum valve 104, 114, 124, 134, 144, 154 and 164, rotary pumps 107, 117, 127, 137, 147, 157 and 167, and exhaust ports 108, 118, 128, 138, 148, 158 and 168, and to the gas introduction systems 109, 119, 129, 139, 149, 159 and 169. Each processing chamber is capable of individually introducing reactive gas and inert gas supplied from the corresponding gas introduction system, according to silicon film formation, insulating film formation and hydrogen annealing. Alternatively, each processing chamber is capable of individually introducing reactive gas and inert gas supplied from the shared gas introduction system. Each processing chamber is capable of individually exhausting them.

In the semiconductor manufacturing apparatus of this embodiment, for example, when the glass substrate is transported from the Si formation chamber 112 to the laser irradiation chamber 122, air exhaustion from the Si formation chamber 112 is sufficiently performed, the vacuum valve 111 is opened at the time when a pressure in the Si formation chamber 112 is approximately equal to that at the substrate transportation chamber 160. The glass substrate is taken out to the substrate transportation chamber 160 using a robot, and, thereafter, the vacuum valve 111 is closed. The glass substrate is taken in to the laser irradiation chamber 122 in the following manner. The laser irradiation chamber 122 has previously undergone air exhaustion so that a degree of vacuum at the laser irradiation chamber 122 will be approximately equal to that of the substrate transportation chamber 160. After the vacuum valve 121 is opened, the glass substrate is transported to the laser irradiation chamber 122 using the robot. Then, the vacuum valve 121 is closed. After the vacuum valve 121 is closed, introduction of necessary gas to the laser irradiation chamber 122 and controlling of pressure and temperature required for the laser irradiation chamber 122 are conducted. Thereafter, laser irradiation is conducted. In procedures similar to those for the laser irradiation chamber 122, sequential transportation of the substrate among other processing chambers will be possible.

Here, it is possible to simultaneously move different substrates among a plurality of processing chambers corresponding to the number of the robots capable of operating at a time. However, in this case, sufficient air exhaustion must be performed for each processing chamber. As a matter of course, after air exhaustion, each processing chamber and the substrate transportation chamber are set at approximately equal pressure in an atmosphere of any of inert gas, nitrogen and hydrogen. Thereafter, opening and closing of the valve and transportation of the substrate may be conducted. For transportation of the substrate between the vacuum load chamber 102, the substrate unload chamber 152 and the air, after nitrogen or inert gas is charged in a state where the vacuum valves 101 and 151 are closed, a valve on the air side (not shown) is released and then loading and unloading of the substrate are carried out.

Figure 4:
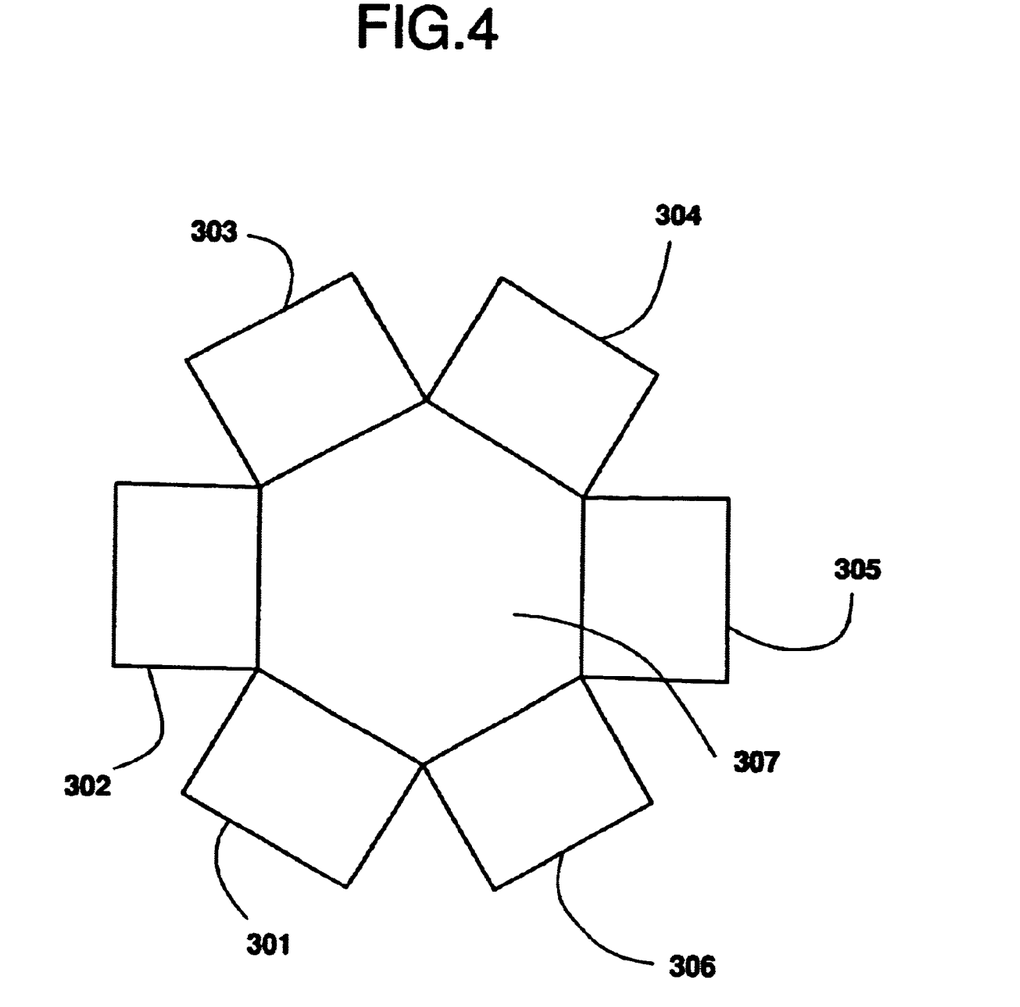
FIG. 4 is a plan view showing a constitution of an embodiment of the semiconductor manufacturing apparatus of the present invention.

An example of the semiconductor manufacturing apparatus of the present invention is shown in FIG. 4. A plasma CVD chamber 302, an excimer laser annealing chamber 303, a hydrogen plasma generating chamber 304, an insulator formation chamber 305 and a vacuum transportation chamber 307 correspond to the Si formation chamber 112, the laser irradiation chamber 122, the hydrogen annealing chamber 142, the insulating film formation chamber 132 and the substrate transportation chamber 160, respectively. It should be noted that a substrate heating chamber may be additionally provided and a substrate heated to a temperature of about 400° C. can be transported using metal and ceramic materials and a cooling apparatus.

Moreover, the plasma CVD chamber 302 with a constitution of FIG. 4 may be replaced with a dry cleaning chamber. In general, in a dry a cleaning method using ultraviolet ray, halogen gas and the like, although an ability to remove a metal and an oxide film is very excellent, an ability to remove particles attached to the surface of the substrate is very poor. Therefore, the substrate should be preferably introduced to the apparatus after cleaning is conducted using the mixed solutions composed of ammonia, hydrogen peroxide and pure water discussed above. It is possible to obtain the same effect by performing removal of the native oxide film in the apparatus.

Figure 5:
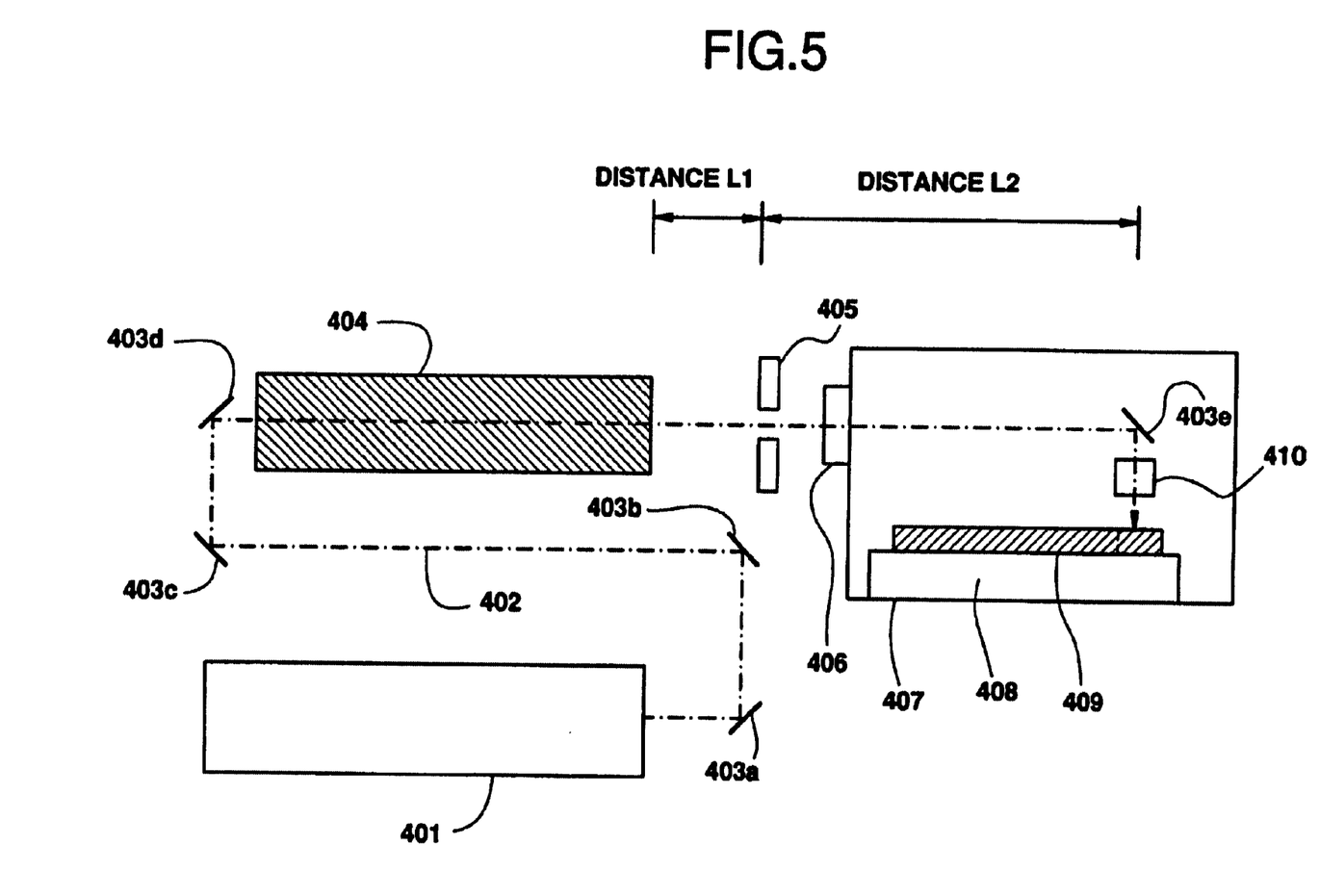
FIG. 5 is a schematic view showing a constitution of an embodiment of a laser irradiation chamber of the present invention.

An embodiment of the foregoing laser irradiation chamber is shown in FIG. 5. A laser beam emitted from the excimer laser 401 travels along the optical path 402, and the laser beam passes through the A to C optical systems 404, 405 and 410 to shape the laser beam to the desired beam and the mirrors 403a to 403e, whereby the laser beam is shaped to the desired beam. The shaped laser beam reaches the surface of the substrate 409 mounted on the substrate holder 408. Here, the optical system 410 and the mirror 403e are installed within the vacuum container constituting the ELA module 407 and are optically coupled to the optical path 402 through the window 406. At the same time, the optical system 410 and the mirror 403e are set to be movable within the vacuum chamber by a driving apparatus (not shown). With such a structure, the entire surface of the glass substrate can be irradiated with a laser beam without moving the glass substrate in the vacuum chamber.

In this embodiment, the example in which the number of the optical systems is three and the number of the mirrors is five is, adopted, that is, the optical systems A to C i.e., 404, 405 and 410 are used and the mirrors 403a to 403e are used. However, these numbers are not intended to limit the scope of the invention. Moreover, the distances between plurality of the optical systems A to C, for example, the distances L1 and L2, are freely set according to the beam shape and the design of the optical systems. However, when the optical path length such as the distances L1 and L2 between the members must be kept constant, either the optical system A or the optical system B, which are positioned on the air side, is moved in association with the optical system C so as not to optically change either the distance L1 or the distance L2, whereby the desired beam shape can be obtained. The substrate onto which the laser is irradiated never moves when the substrate is fixed to the substrate holder. Accordingly, the setting area for the substrate does not need to accommodate the lateral movement of the substrate and can have dimension less than twice the length and width of the substrate. Furthermore, all of the optical systems A to C. shown in the drawing can be also located within the ELA module 407 from which the air can be exhausted until it becomes a vacuum state, depending on the desired beam shape.

The same object can be achieved by providing a window of a scale equivalent to that of the glass substrate in the ELA module 407. In other words, a window made of quartz having a larger size than that of the glass substrate is provided on the upper surface of the ELISA module opposite the substrate, whereby the irradiation position of the laser beam on the fixed glass substrate is moved without the optical system and the like being disposed within the vacuum chamber. However, in the case where an excimer laser which is an ultraviolet ray is employed as a thermal processing light source in such method, a window material made of quartz which is about several 100 mm square and transmits ultraviolet rays and which has a mechanical strength for keeping the container in a vacuum condition is necessary. According to the present invention, the laser irradiation can also be easily carried out in accordance with enlargement of the desired glass substrate size, without the necessity of the large sized window material.

Figure 6:
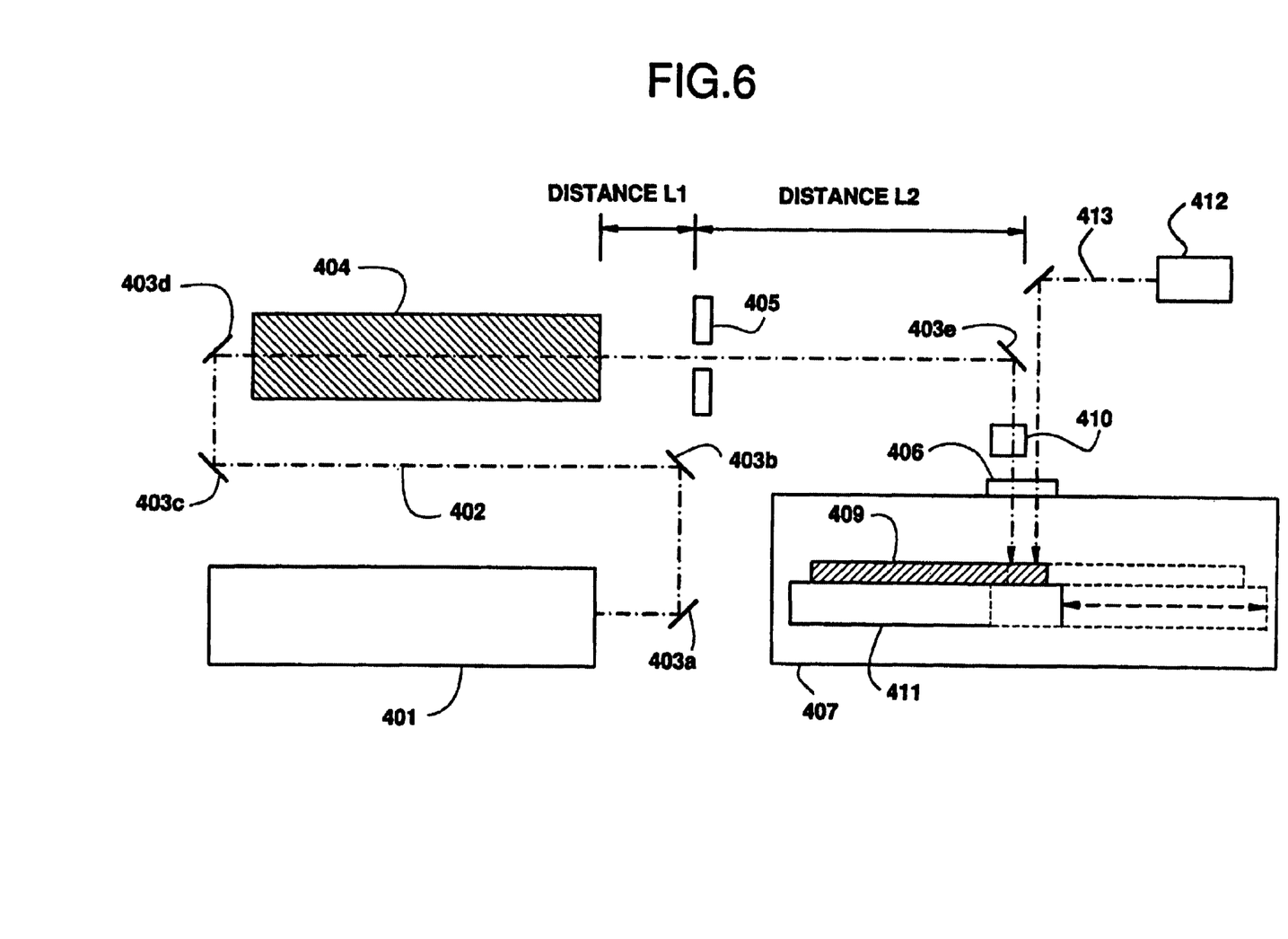
FIG. 6 is a schematic view showing a constitution of another embodiment of the laser irradiation chamber of the present invention.

Moreover, another embodiment of the laser irradiation chamber of the present invention is shown in FIG. 6. The same reference numerals as those in FIG. 5 are given to the same or equivalent portions. In this embodiment, similar to the conventional laser irradiation system, an x-and y-driving substrate holder 411 is provided within a container constituting an ELA module 407. A substrate 409 is mounted on the x-and y-driving substrate holder 411, whereby laser light is irradiated onto the substrate 409 while moving the substrate 409. In this embodiment, Ar laser 412 is introduced-on the surface of the substrate 409 through the optical path 413, while keeping the same distance as that of the optical path 402 of excimer laser. By controlling the intensity of the Ar laser 412, the irradiation region on the silicon thin film produces an ablation so that the thermally treated silicon region and the silicon region producing the ablation always possess constant values.

Figure 7A:
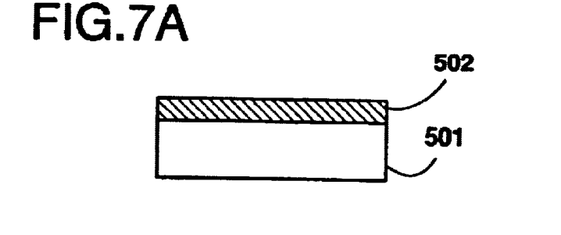
FIG. 7A–FIG. 7D are section views and an upper plan view for explaining a formation method of a mark by laser irradiation.
Figure 7B:
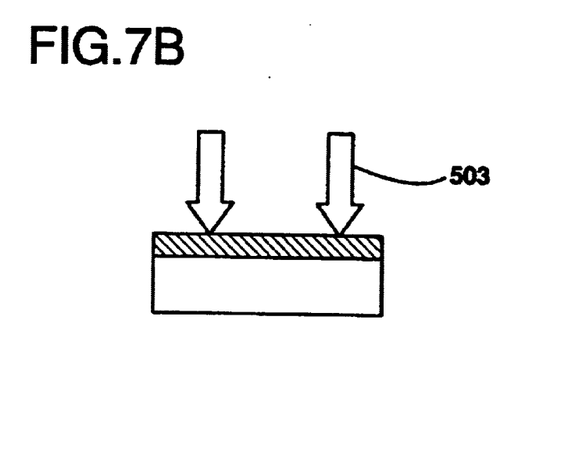
Figure 7C:
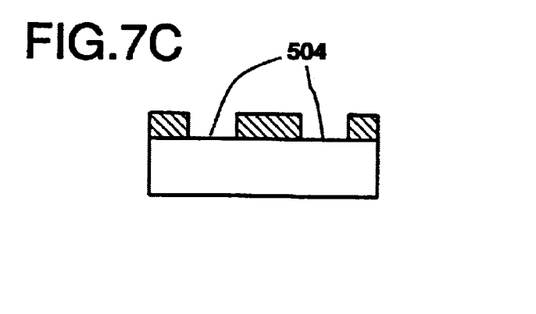
Figure 7D:
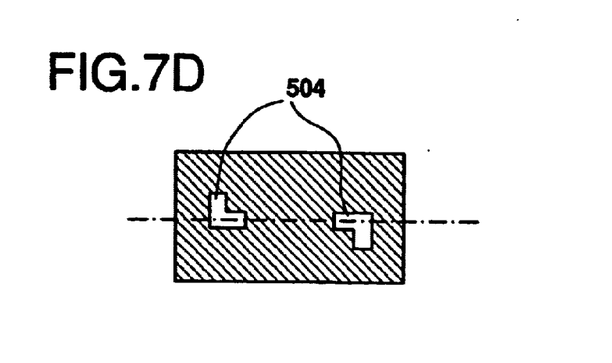

As shown in FIGS. 7A to 7D, by utilizing the laser irradiation chamber of this embodiment, the silicon thin film 502 is partially removed so that the silicon thin film 502 is formed in a predetermined shape, thereby forming a marker 504. Thus, a region to be thermally processed by excimer laser can be detected. In other words, as shown in FIG. 7A, for the silicon thin film 502 formed on the entire surface of the glass substrate 501, the laser 503 is irradiated onto the desired region of the silicon thin film 502, as shown in FIG. 7B. As shown in FIG. 7C which illustrates the section view of the resultant structure and as shown in FIG. D which illustrates the plan view thereof, the portions of the silicon thin film 502 undergoing the irradiation of the laser 503 are removed. The removed portions where the silicon thin film 502 is removed are utilized for the markers 504. Formation of the markers 504 can be conducted by the method for scanning an Ar laser, a YAG or a semiconductor laser onto the substrate as described above. Alternatively, formation of the marker 504 can be also conducted by excimer laser for thermal processing. In a case where an excimer laser is used, the intensity of irradiation pulses must be increased compared to the condition for performing thermal processing, or the number of irradiation pulses must be increased. Moreover, for formation of a marker having a desired shape, a light shielding plate having a slit in the optical path 402 may be temporarily disposed. By taking out the light shielding plate at the time of the thermal processing, formation of the marker and the thermal processing can be conducted by the same excimer laser.

Figure 8A:
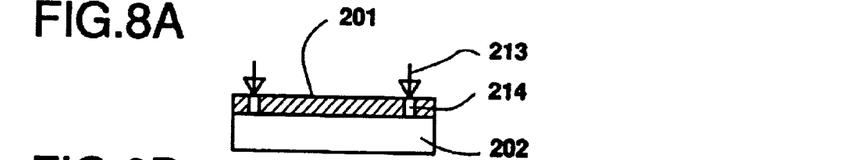
FIG. 8A–FIG. 8G are section views showing a first example of a thin film transistor manufacturing method of the present invention.
Figure 8B:
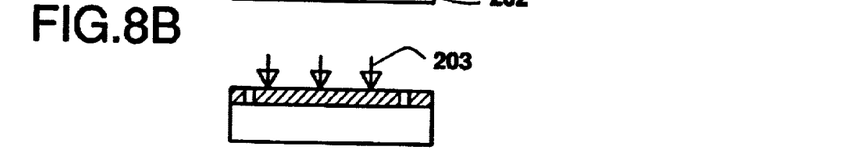
Figure 8C:
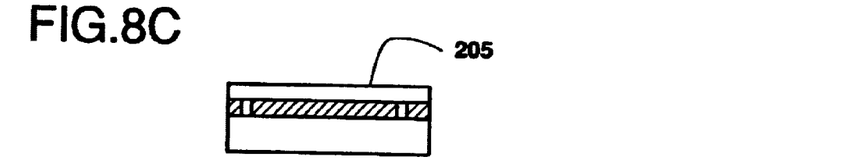

A thin film transistor manufacturing method using the foregoing semiconductor manufacturing apparatus and the laser irradiation chamber will be described. FIGS. 8A to 8G show a first example. As shown in FIG. 8A, an amorphous silicon film 201 is formed on the surface of the substrate 202 which is a glass substrate covered with $SiO_2$ film, the surface of the substrate having been sufficiently cleaned. Thereafter, a marker 214 is formed using Ar laser 213 in the same apparatus without taking out the substrate 202 to expose it to the air. Further, as shown in FIG. 8B, excimer laser 203 is irradiated onto the substrate 202 in the same apparatus, while matching with the marker 214, followed by performing of hydrogenation. Subsequently, as shown in FIG. 8C, an $SiO_2$ layer 205 as a first gate insulating film is formed using a plasma CVD method. These steps are sequentially conducted in the same apparatus.

Figure 8D:
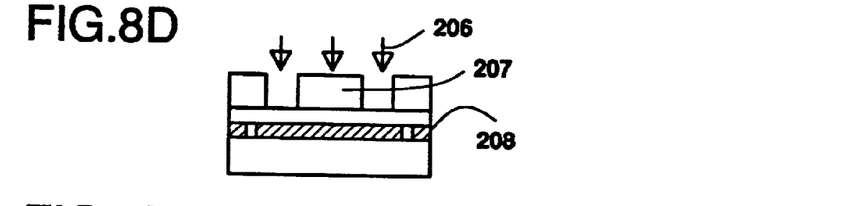
Figure 8E:
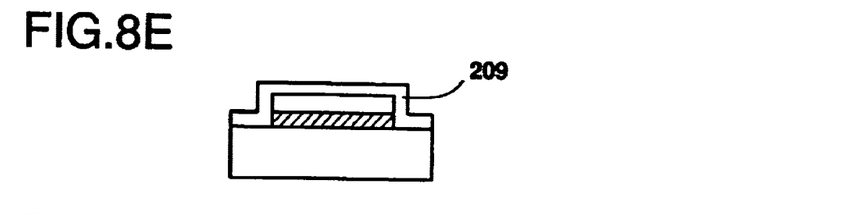
Figure 8F:
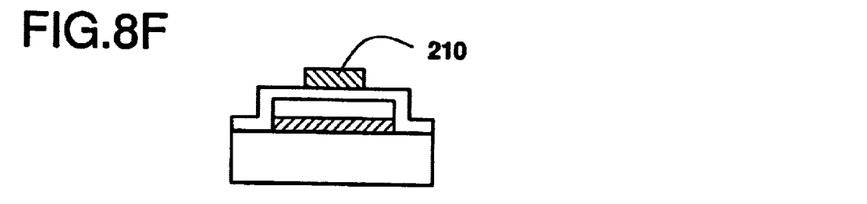
Figure 8G:
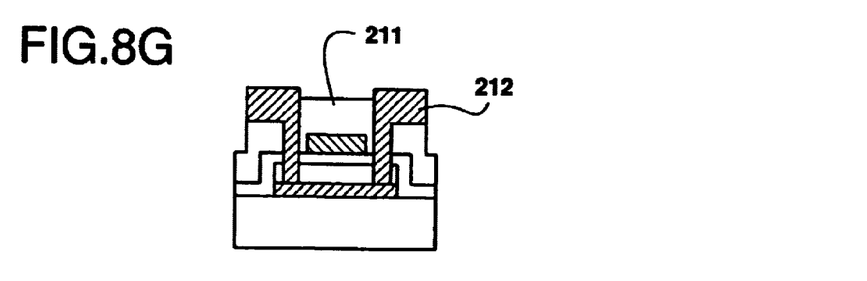

Next, as shown in FIG. 8D, phosphorus ions 206 are implanted by an ion implantation method, using a resist 207 as a mask, thereby forming n+ source/drain region 208. Here, only phosphorus ions are implanted. However, in case of a p channel TFT circuit, boron is implanted. Moreover, in case of a complementary circuit formation, boron implantation as well as phosphorus implantation is conducted, thereby forming an n channel TFT and a p channel TFT. Next, as shown in FIG. 8E, the resultant structure is converted to an island shape, and a second gate insulating film 209 is formed. At this time, although the marker region is removed, there is no problem as long as another marker is formed at the time of formation of the island. Excimer laser is irradiated again to activate the source/drain region. Thereafter, as shown in FIG. 8F, a gate electrode 210 is formed, followed by formation of an interlayer insulating film 211 and a contact hole as shown in FIG. 8G. Then, a source/drain electrode 212 is formed.

Figure 9A:
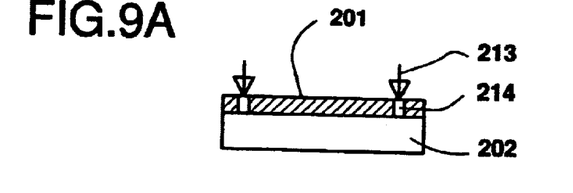
FIG. 9A–FIG. 9F are section views showing a second example of a thin film transistor manufacturing method of the present invention.
Figure 9B:
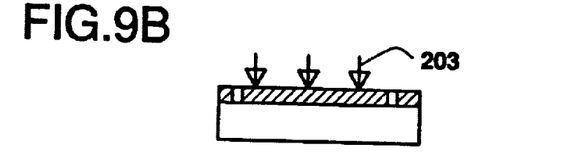
Figure 9C:
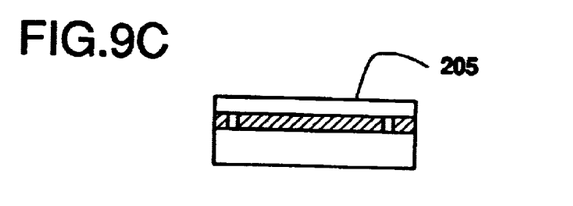
Figure 9D:
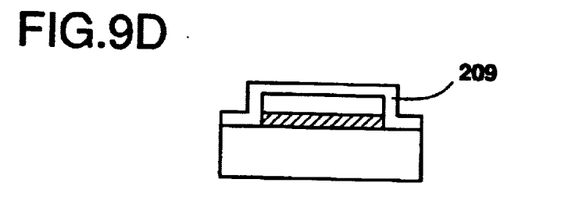

FIGS. 9A to 9F show a second example of the thin film transistor manufacturing method. As shown in FIG. 9A, an amorphous silicon film 201 is formed on the surface of the substrate 202 which is a glass substrate covered with an $SiO_2$ film, the surface of the substrate having been sufficiently cleaned. Thereafter, a marker 214 is formed using Ar laser 213 in the same apparatus, without taking out the substrate to the outside to expose it to the air. Moreover, as shown in FIG. 9B, excimer laser 203 is irradiated in the same apparatus, while matching with the marker 214, followed by hydrogenation. Subsequently, as shown in FIG. 9C, an $SiO_2$ layer 205 as a first gate insulating film is formed using a plasma CVD method. These steps are sequentially conducted in the same apparatus. Next, as shown in FIG. 9D, the resultant structure is formed to an island shape, and a second gate insulating film 209 is formed. At this time, there is no problem as long as another marker is formed, although the marker region is removed.

Figure 9E:
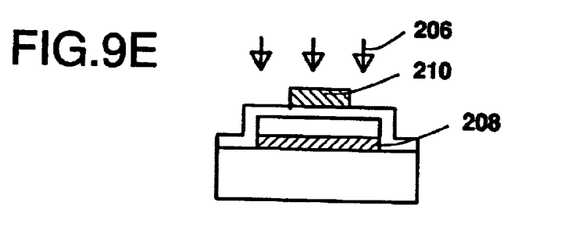
Figure 9F:
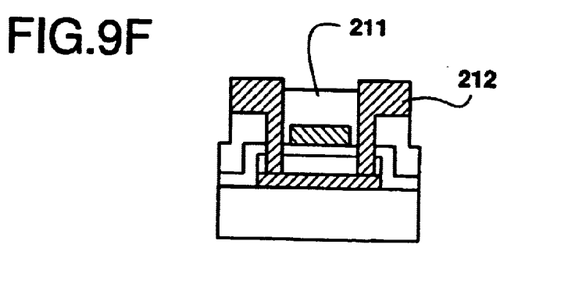

Moreover, as shown in FIG. 9E, after a gate electrode 210 is formed, phosphorus ions 206 are implanted using the gate electrode 210 as a mask, by an ion implantation method, thereby forming an n+ source/drain region 208. Here, although only implantation of the phosphorus ions is shown, in the case of a p channel TFT, implantation of boron is performed. In the case of formation of a complementary circuit, formation of a mask member is conducted twice, and boron implantation in addition to the phosphorus implantation is conducted, whereby an n channel TFT and a p channel TFT are formed. Thereafter, as shown in FIG. 9F, the mask member is removed, and excimer laser is again irradiated, followed by activation of the source/drain region. Then, after an interlayer insulating film 211 and a contact hole are formed, a source/drain electrode 212 is formed. According to this embodiment, it is possible to form a self-aligned type TFT, whereby a parasitic capacitance between a gate and a source/drain can be reduced.

Figure 10A:
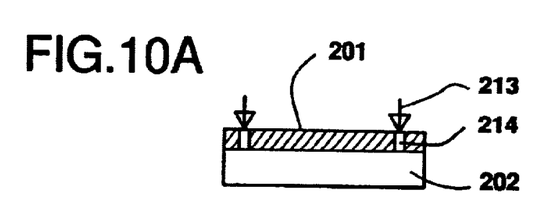
FIG. 10A–FIG. 10F are section views showing a third example of a thin film transistor manufacturing method of the present invention.
Figure 10B:
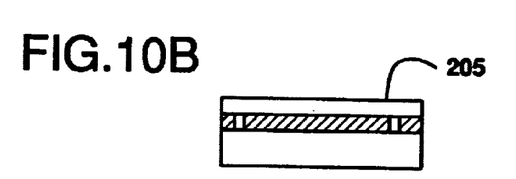
Figure 10C:
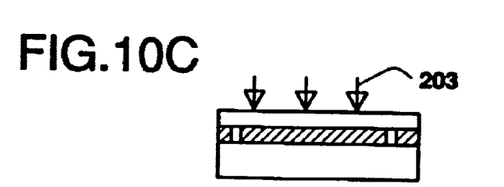
Figure 10D:
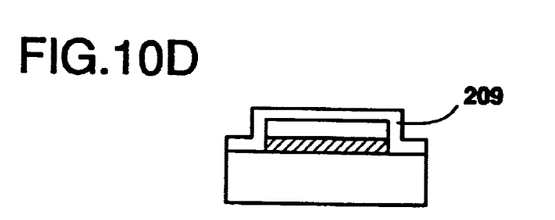

FIGS. 10A to 10F show a third example. As shown in FIG. 10A, an amorphous silicon film 201 is formed on the surface of the substrate 202 which is a glass substrate covered with an SiO$_2$ film, the surface of the substrate 202 having been sufficiently cleaned. Thereafter, a marker 214 is formed using Ar laser 213 in the same apparatus, without taking out the substrate 202 to the outside to expose it to the air. Next, as shown in FIG. 10B, an SiO$_2$ layer 205 as a first gate insulating film is formed by a plasma CVD method. Moreover, as shown in 10C, in the same apparatus, excimer laser 203 is irradiated while matching with the marker, sequentially followed by hydrogenation. Formation of the marker may be after formation of the SiO$_2$ layer. These steps are sequentially performed in the same apparatus. Next, as shown in FIG. 10D, the resultant structure is formed to an island shape, and a second gate insulating film 209 is formed. At this time, even when the marker region is removed, there is no problem as long as another marker is formed.

Figure 10E:
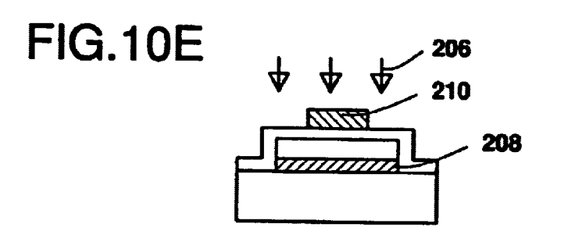
Figure 10F:
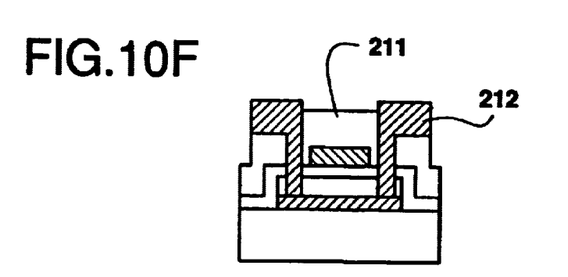

Furthermore, as shown in FIG. 10E, after a gate electrode 210 is formed, phosphorus ions 206 are implanted by an ion implantation method, using the gate electrode 210 as a mask, thereby forming an n+ source/drain region 208. Here, implantation of the phosphorus ions is shown. However, in the case of a p channel TFT circuit, implantation of boron is carried out, and in the case of formation of a complementary circuit, formation of a mask member is performed twice, and implantation of boron as well as implantation of phosphorus is carried out, thereby forming an n channel TFT and a p channel TFT. The mask member is removed, and excimer laser is again irradiated, thereby activating the source/drain region. Thereafter, as shown in FIG. 10F, after an interlayer insulating film 211 and a contact hole are formed, a source/drain electrode 212 is formed. According to this embodiment, it is possible to form a self-aligned type TFT, and it is possible to reduce a parasitic capacitance between a gate and a source/drain. Moreover, since it is possible to perform laser irradiation after formation of the interlayer insulating film, a semiconductor-insulating film interface will be exposed to a high temperature for a short time. Therefore, a high quality semiconductor-insulating film interface can be formed owing to reduction in an interface energy level.

It should be noted that the above-described manufacturing steps can be performed while keeping temperature of the glass substrate at 350° C. or less during all steps. In this embodiment, acid-alkaline base cleaning solution (cleaning solution such as ammonia/hydrogen peroxide/pure water, hydrochloric acid/hydrogen peroxide/pure water, sulfuric acid/hydrogen peroxide, hydrofluoric acid/pure water) is used. Interface active agent and hydrogen added with ozone may be used as occasions demand. Barium borosilicate acid glass, aluminum borosilicate acid glass, borosilicate glass, aluminum silicic acid glass, and aluminum silicate glass, which contain a small amount of alkali metal components, may be used as the glass substrate. A sputtering method and a plasma CVD method are used for formation of the Si film 201, and the plasma CVD method, the sputtering method and deposition method are used for formation of the SiO$_2$ film 209. For ion implantation of impurities, an ion doping method in which ions are injected ions without mass separation is also used. For an activation technology, a method to irradiate laser and a self activation method by ion doping are possible.

As described above, according to the present invention, the steps such as formation of the silicon thin film and dry cleaning for it, formation of the insulating thin film, laser irradiation and hydrogen annealing can be continuously performed in the vacuum chamber without being exposed to the air. Therefore, a high performance multifunction semiconductor manufacturing apparatus can be realized. Moreover, a semiconductor manufacturing method with a low cost and a high reproducibility can be also realized. Thus, it is possible to form a high performance thin film transistor on a glass substrate of a large area. Particularly, a first effect of the present invention is that one cleaning step using chemicals can be eliminated and a semiconductor thin film process with a high stability can be realized. This is because a manufacturing apparatus capable of performing the steps from formation of the semiconductor thin film to formation of the gate insulating film interface in the same apparatus is used. Furthermore, this is also because a manufacturing method of a low cost and high performance thin film transistor is adopted, the method being capable of keeping the silicon surface (interface) clean.

Furthermore, a second effect of the present invention is that a semiconductor processing apparatus capable of reducing to setting s to be half to a factor of $4\frac{1}{2}-1/4$ smaller in size than in conventional apparatus can be realized. This is because laser crystallization is made possible without moving the substrate. This results in promoting the multifunction of the manufacturing apparatus on the same area.

A third effect of the present invention is that the TFT formation region is detectable without increasing cleaning and PR steps. This is because mark formation means requiring no photolithography step is used.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor manufacturing apparatus comprising:
   a laser light source for irradiating a laser beam onto a substrate set in a vacuum container; and
   an optical system for shaping said laser beam emitted from said laser light source,
   wherein said optical system is movably disposed within said vacuum container such that said laser beam can be irradiated onto all regions of said substrate;
   wherein said optical system is constituted such that an irradiation area of said laser beam to be irradiated at one time is smaller than an area of said substrate and said laser beam is irradiated onto different regions of said substrate without changing an optical path length of said laser beam of said optical system, such that said optical path length to said substrate is fixed.

* * * * *